United States Patent [19]

Angelucci et al.

[11] 4,050,618
[45] Sept. 27, 1977

[54] FLEXIBLE LEAD BONDING APPARATUS

[76] Inventors: Thomas L. Angelucci, Sr., 89 Charlan Circle, Cherry Hill, N.J. 08003; Joseph L. Angelucci, 1948 Little Drive, Deptford, N.J. 08096

[21] Appl. No.: 588,289

[22] Filed: June 19, 1975

[51] Int. Cl.² .......................................... H01L 21/60
[52] U.S. Cl. ................................... 228/6 A; 228/5.7; 228/180 A; 226/62; 226/117
[58] Field of Search .................. 29/203 B, 626, 627; 228/4.1, 5.7, 6 A, 8, 180 A; 219/85 F, 79, 80; 226/55, 57, 62, 67, 64, 117

[56] References Cited

U.S. PATENT DOCUMENTS

| 1,305,002 | 5/1919 | Oiler | 226/57 |
|---|---|---|---|
| 1,444,884 | 2/1923 | Pittman | 226/67 X |
| 1,767,846 | 6/1930 | Howell | 226/67 X |
| 2,046,572 | 7/1936 | Merta | 226/67 |
| 2,322,501 | 6/1943 | Barnitz | 228/8 |
| 3,477,630 | 11/1969 | Schneider | 228/6 A |
| 3,586,223 | 6/1971 | Betts | 226/117 X |
| 3,771,711 | 11/1973 | Lesyk et al. | 228/6 A X |
| 3,831,252 | 8/1974 | Miller | 29/203 B |
| 3,840,163 | 10/1974 | Diepeveen | 226/64 |
| 3,900,257 | 8/1975 | Woolley, Jr. et al. | 226/62 X |
| 3,949,925 | 4/1976 | Keizer et al. | 228/6 A |

Primary Examiner—Al Lawrence Smith
Assistant Examiner—K. J. Ramsey

[57] ABSTRACT

An apparatus for bonding the flexible leads of a sprocketed lead frame tape to the terminals of an integrated circuit device is provided with a movable index station, movable bonding anvil means and a vertically moving bonding tool. The flexible leads on the lead frame tape are automatically positioned by the indexing station relative to the bonding tool with extreme final accuracy. The device to be bonded to the flexible leads may be manually or automatically positioned relative to said bonding tool to align the bonding tool, the flexible leads and the integrated circuit device terminals in axial bonding alignment.

18 Claims, 11 Drawing Figures

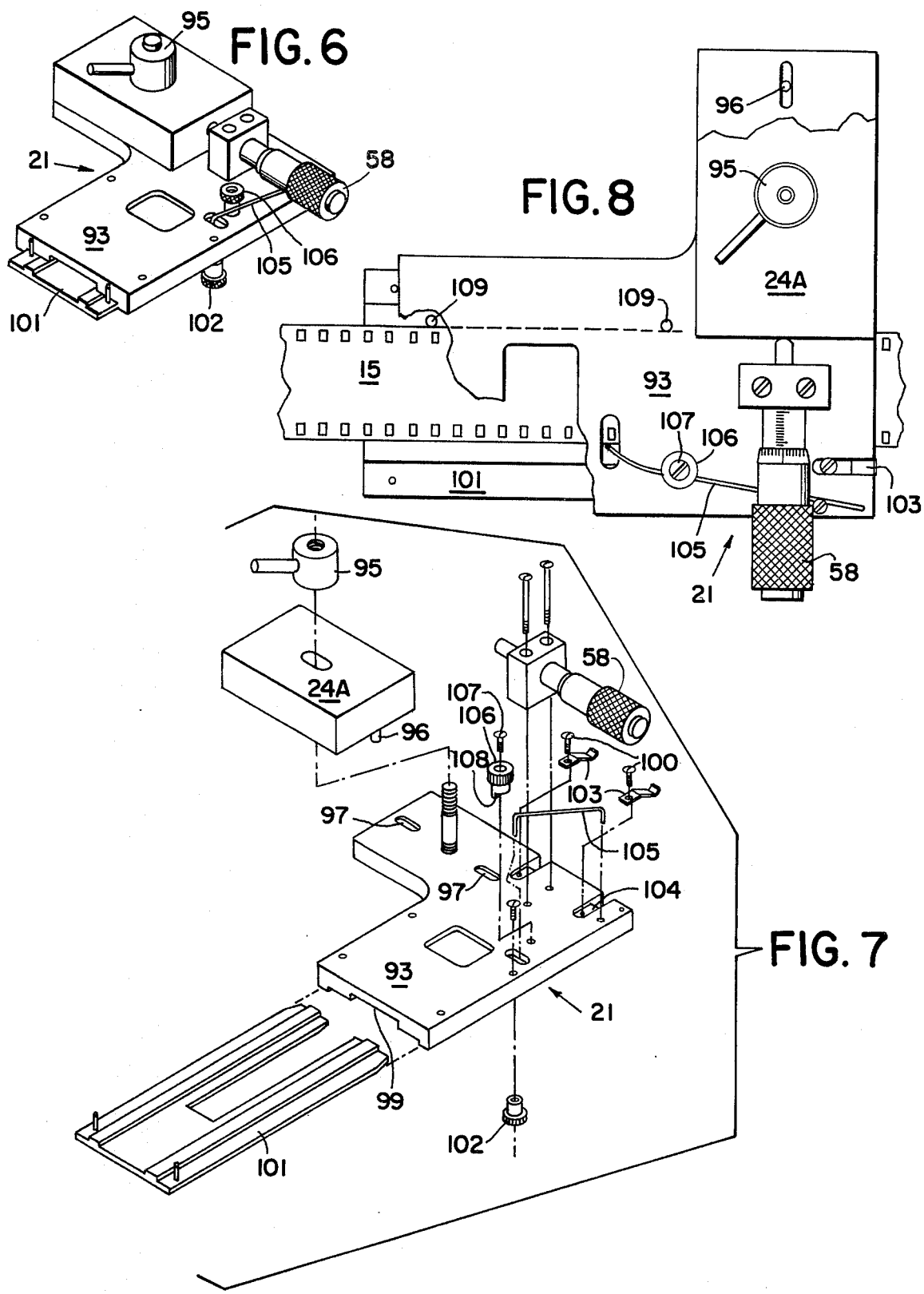

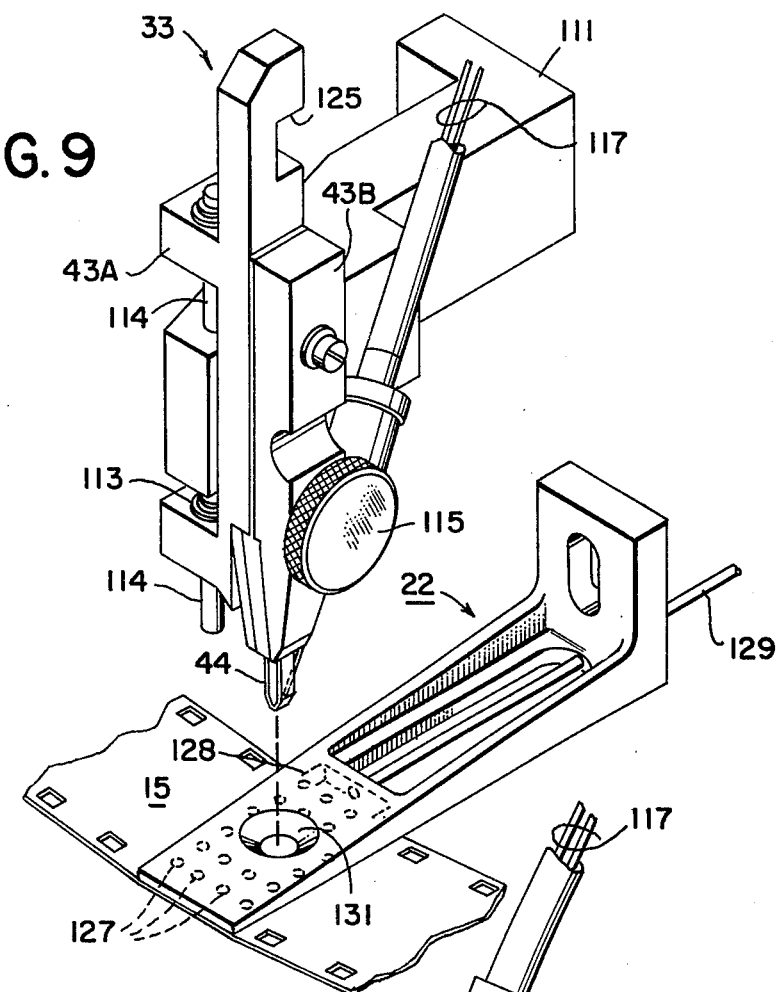
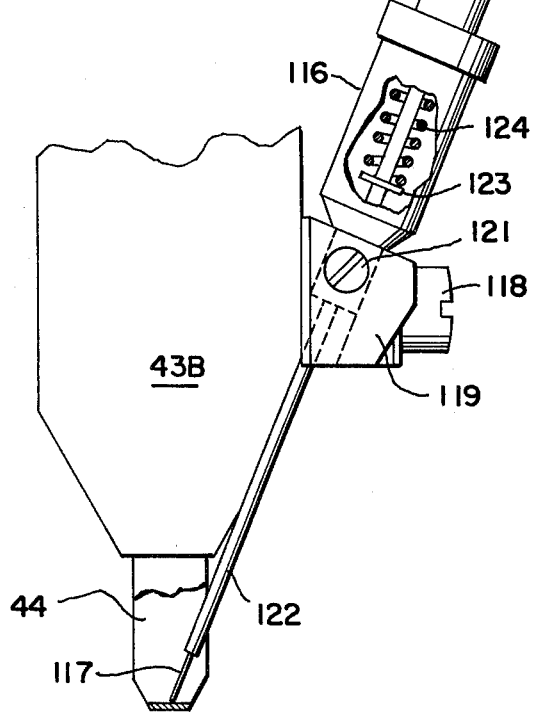

FLEXIBLE LEAD BONDING APPARATUS

BACKGROUND OF THE INVENTION

1. Field of the Invention

This invention relates to lead bonding machines for semi-conductor devices. More particularly, this invention relates to machines for gang bonding integrated circuit devices to the flexible conductive leads of a conductive foil pattern carried on a sprocketed lead frame tape. Machines of the type disclosed herein have been referred to as gang lead bonders, inner lead bonders, outer lead bonders and flexible lead bonders.

Bonding machines of the type described herein are provided with reels of flexible lead frame tape having micro etched patterns wherein the etched patterns have conductive fingers arranged so that the ends of the conductive fingers will match the pattern of terminals on the integrated circuit chips or on the substrate to which the fingers are to be bonded.

2. Description of the Prior Art

The trend in the manufacture of semiconductor devices is to make larger and more complex integrated circuit devices. The number of active devices per unit of area base material is being increased which aids in making the individual active devices faster and cheaper. The internal connections between components and active devices in such semiconductor devices are made during the process of producing the integrated circuit chip.

The single most time consuming assembly operation in the manufacture and packaging of semiconductor devices is the wire bonding or lead attaching operation wherein conductive wires or prefabricated leads are attached to the terminals of an integrated chip and the other end of each of the wires or prefabricated leads is connected to a substrate or supporting carrier assembly.

Heretofore, it has been common practice to wire bond one terminal at a time with metal conductive wires employing manually operated wire bonding machines.

Beam lead bonding machines have been made for bonding expensive specially designed integrated circuit chips to substrates. Beam lead bonding chips are provided with cantilever leads which extend outward from the chip. The extended leads on the chip may be superimposed over a pattern on a substrate and the gold beam leads are thermal compressions bonded to the substrate. Heretofore it has been almost impossible to maintain the face of the bonding tool coplanar with the terminals or the substrate so as to maintain uniformly the pressure on each of the beam leads while attempting to simultaneously bond the beam leads to the substrate. To overcome the problem of non uniform bonding pressure such techniques as compliant bonding and the use of wobble bonding tools have been employed. Gang bonding of beam lead devices is difficult to maintain in production, is expensive and by the nature of the device reduces the yields of chips per wafer and requires a slow bonding process.

Before beam lead integrated circuit devices were popular, solder flip-chip integrated circuits were bonded to substrates. This technique creates problems in aligning the solder bumps on the integrated circuit with the conductors or pads on the substrate. Further, solder flip-chip devices are not usable in processes which require reheating the substrate or the flip-chip device above the solder temperature.

To overcome the above and other problems, flexible lead frame tapes have been employed. The flexible conductor leads or fingers carried on the lead frame tapes have been bonded to the terminals of integrated circuit chips. Flexible lead bonders have made it easier to align the bonding tool surface with the surface of the integrated circuit device and by employing solder eutectics and/or collapsible metal bumps on the integrated circuit devices have eliminated the need for exact coplanar alignment.

Heretofore, it has been necessary to manually adjust the final relationship or position of the integrated circuit terminals to the fingers or leads on the pattern of the lead frame carrier because the lead frame patterns being bonded to the integrated circuit device are not precisely located relative to the sprocketed holes used for locating the pattern. Further, the indexing mechanisms of the bonding machines heretofore employed to advance and locate the lead frame tape frame pattern have introduced errors which had to be compensated for by manual adjustment. These and other problems to be discussed herein after have prevented the best utilization of accurate automatic indexing tables. Such automatic indexing tables are capable of holding and advancing the integrated circuit chips on an anvil opposite the lead frame patterns more accurately than has been heretofore possible to locate the lead frame pattern relative to the bonding tool.

SUMMARY OF THE INVENTION

The present invention provides a flexible lead frame bonding machine which has a tape advance and control mechanism which will position the lead frame patterns accurately opposite the bonding tool of a bonding station fully as accurate as the pattern is placed on the lead frame tape.

The present invention provides a lead frame bonding machine with a tape advance and control mechanism which eliminates cumulative errors which occur in the sprocketed holes or the patterns in the lead frame.

The present invention provides a lead frame bonding machine which positions the fingers or leads of a lead frame tape pattern coplanar with the conductive terminals on the integrated circuit device.

It is a general object of the present invention to provide a novel flexible lead bonding machine having improved indexing accuracy.

It is another object of the present invention to provide a flexible lead bonding machine having quick tool replacement, a quick changable thermocouple device, quick loading tape advance mechanism and quick loading metering sprockets. It is another general object of the present invention to provide in a flexible lead bonding machine means for making micrometer adjustments of the transverse and axial position of the lead frame tape relative to the position of the bonding tool.

It is yet another object of the present invention to provide force and temperature transducers for driving digital displays.

These and other objects of the present invention will become more apparent from the more detailed description of the specification and the accompanying drawings.

BRIEF DESCRIPTION OF THE DRAWINGS

FIG. 6 is an isometric view of the index station transverse positioning guide.

FIG. 7 is an exploded isometric view of the transverse positioning guide of FIG. 6.

FIG. 8 is an enlarged planned view of the transverse positioning guide of FIGS. 6 and 7.

FIG. 9 is an isometric view of the bonding station.

FIG. 10 is an enlarged side elevation of the bonding tool holder and bonding tool showing the mounting of the thermocouple device.

DESCRIPTION OF THE PREFERRED EMBODIMENT

Figure 1:
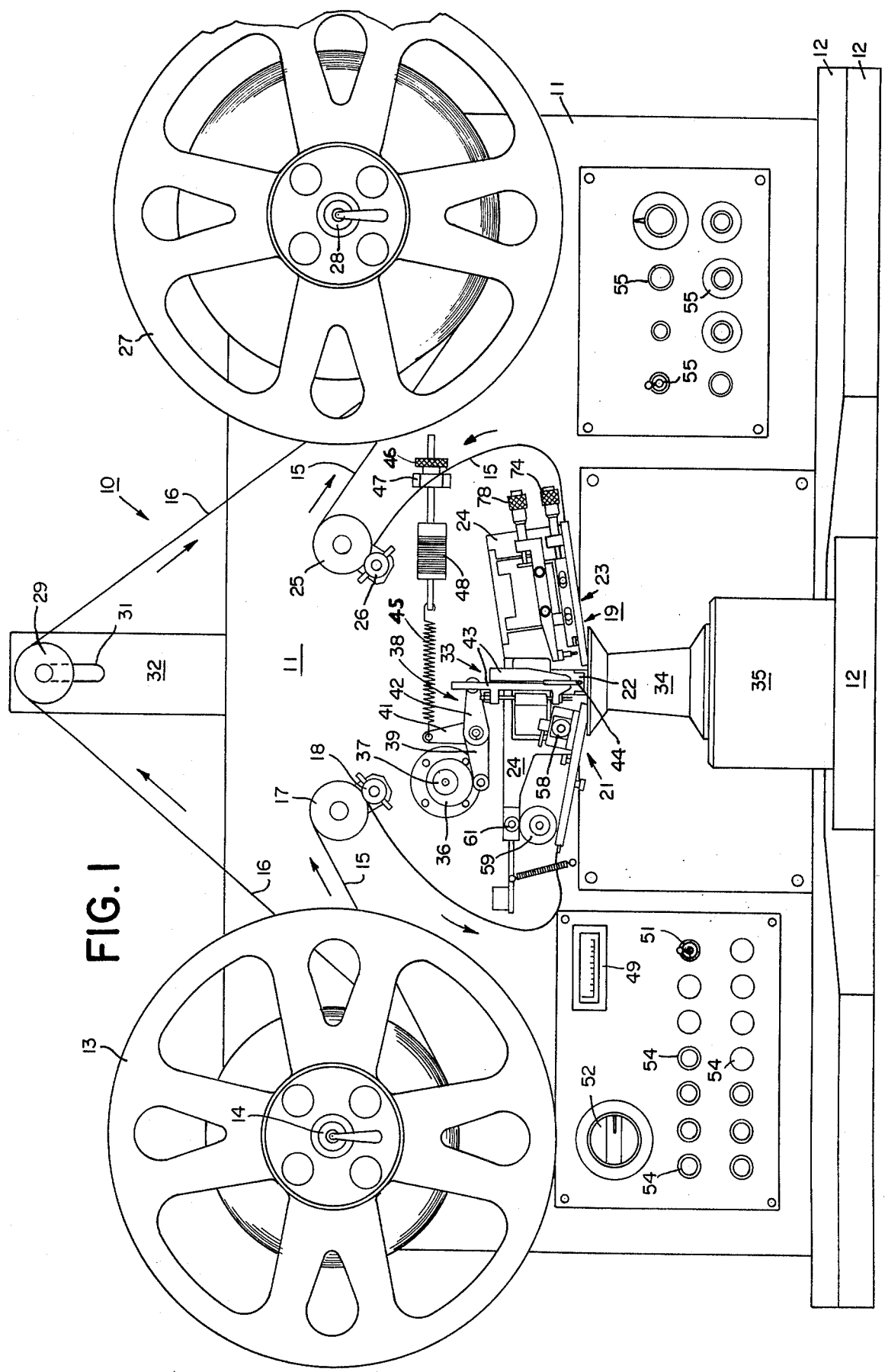
FIG. 1 is a front elevation of the preferred embodiment flexible lead bonding machine.
Figure 2:
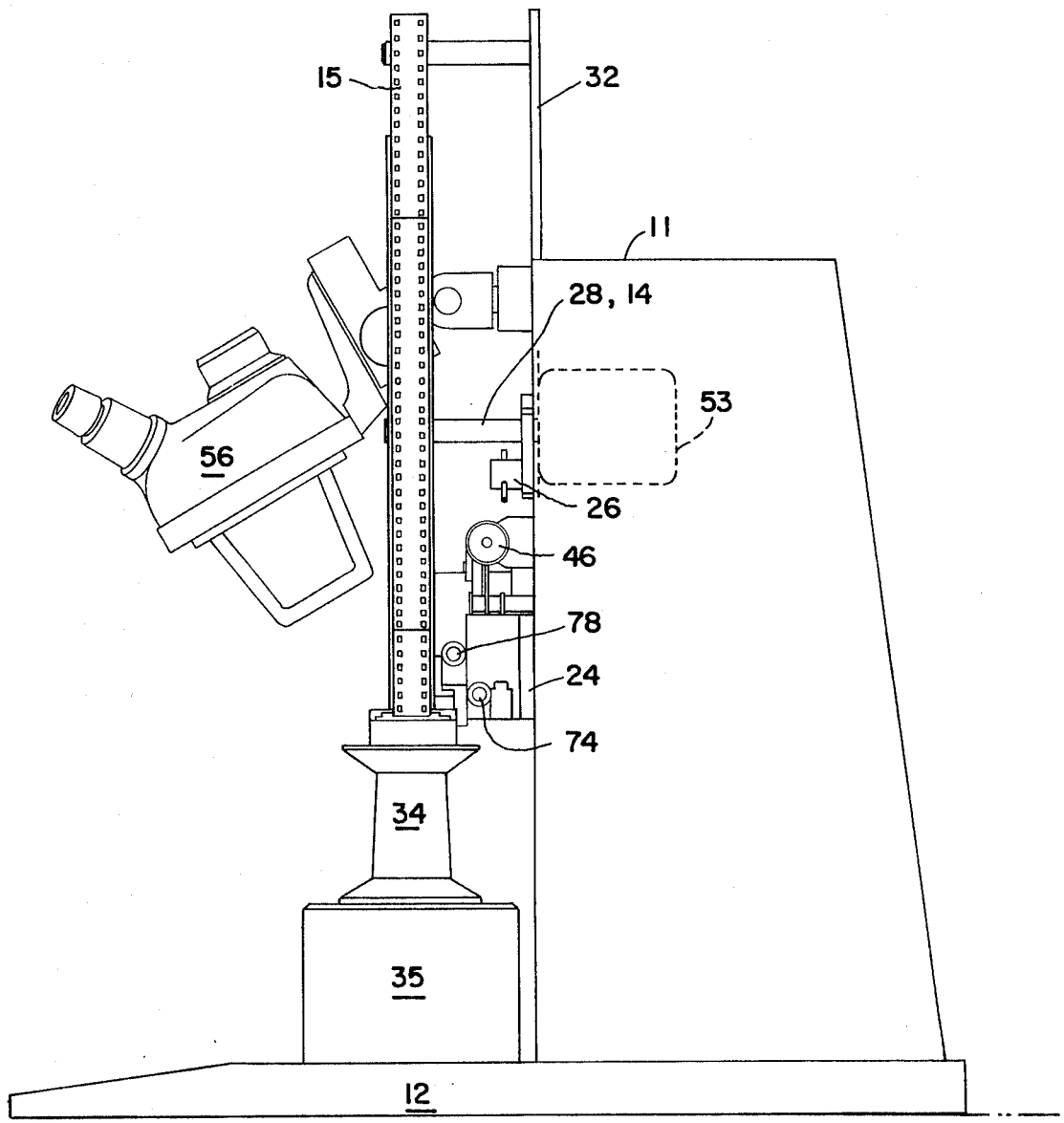
FIG. 2 is a side elevation of the bonding machine of FIG. 1.
Figure 3:
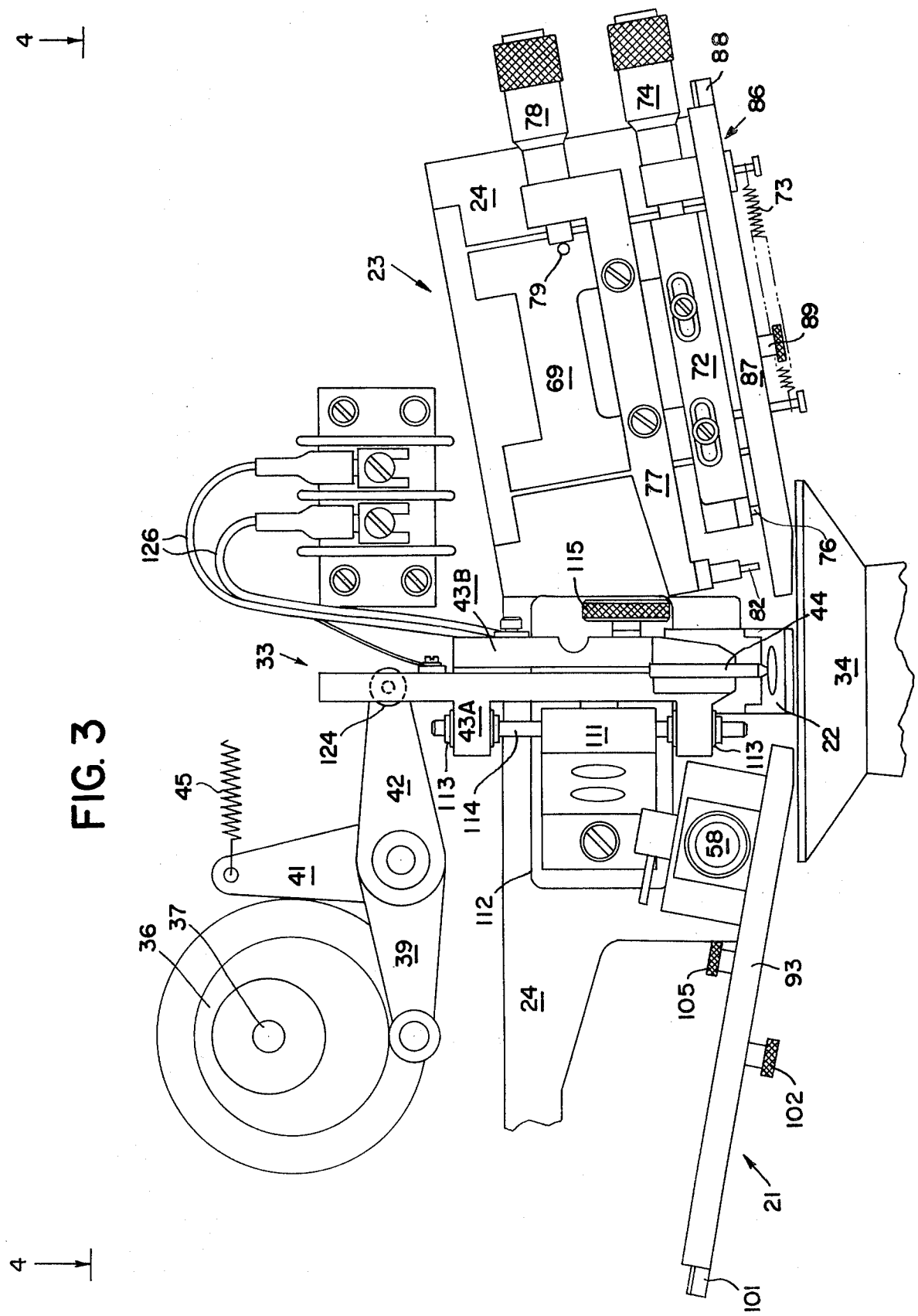
FIG. 3 is an enlarged front elevation of the bonding station and index station shown in FIG. 1.

Refer now to FIGS. 1 to 3 showing the front and side elevations of the preferred embodiment of the present invention. Vertical support frame 11 is connected to and supported by table like base 12. Supply reel 13 is rotateably mounted on shaft 14 extending from support frame 11 and has wound thereon a supply of sprocketed lead frame tape 15 and separator tape 16. Sprocketed lead frame tape 15 is lead over metering sprocket 17 and is guided by pad roller 18. It will be understood that metering sprocket 17 has prongs not shown which engaged the sprocket holes of the lead frame tape but could be replaced by a properly designed and pinch roller. Lead frame tape 15 is loosely looped and guided into index station 19 which comprises tape transverse positioning guide 21, shoe 22 and means for advancing the lead frame tape 23, all of which are mounted on pivoted housing 24. Lead frame tape 15 is guided through tape transverse positioning guide 21, under shoe 22 and through a guide in the means for advancing the lead frame tape and loosely looped and threaded over second metering sprocket 25 and held and guided by pad roller 26. Tape 15 enters onto take up reel 27, along with separator 16, mounted on shaft 28. As will be explained hereinafter, supply reel maintains a tension on tape 15 between reel 13 and metering sprocket 17. A second torque motor maintains tension on tape 15 between second metering sprocket 25 and reel 27. The same drive motor drives metering sprockets 17 and 25 so as to maintain the amount of tape constant between metering sprockets. Idler pulley 29 is adjustably mounted in slot 31 on idler arm 32 so as to maintain slack in separator tape 16 between reels 13 and 27. Sprocketed lead frame tape 15 will be indexed by idexing station 19 a pattern at a time and will position a microetched pattern with conductive fingers opposite bonding station 33. A pluraity of integrated circuit chips with conductive terminals matching the conductive fingers of the tape patterns are supported on anvil or vacuum chuck 34 mounted on a pedestal or X-Y table 35 which in turn is supported on the base 12. When the terminals on the integrated circuit chip are aligned with the fingers of the flexible leads of the micro etched pattern the operator or automatic controls will initiate a bonding operation. The bonding operation causes drive cam 36 which is mounted on drive shaft 37 to rotate clockwise permitting bell crank lever 38 having follow arm 39, force arm 41 and drive arm 42 to rotate pivot shaft 43 clockwise. As follow arm 39 disengages drive cam 36, drive arm 42 will force slidably mounted tool handler 43 vertically downward to engage heated bonding tip 44 into engagement with the flexible conductive fingers of the pattern on the lead frame tape 15 and to bond the flexible leads or fingers to the conductive terminals of the integrated circuit device supported on anvil or vacuum chuck 34.

The force applied to bonding tip 44 is controlled by load spring 45. The tension in spring 45 is controlled by adjusting screw 46 which is supported by arm 47 which is connected to support frame 11. Load cell transducer 48 senses the load in load spring 45 and the force on transducer 48 is selectably displayed at digital display 49 by selector switch 51. Torque control knob 52 is provided to adjust the amount of constant torque applied at shafts 14 and 28 by constant torque motors 53.

Bonding machine 10 is further provided with a plurality of main switch controls 54 and bonding tool power supply controls 55 on the panels shown in FIG. 1. Bonding machine 10 is further provided with a microscope 56 mounted on a mount 57 for observing and setting the index position of the pattern of the lead frame tape. As will be explained in greater detail hereinafter, the transverse positioning guide 21 is provided with a micrometer 58 for making this precision adjustment.

Figure 4:
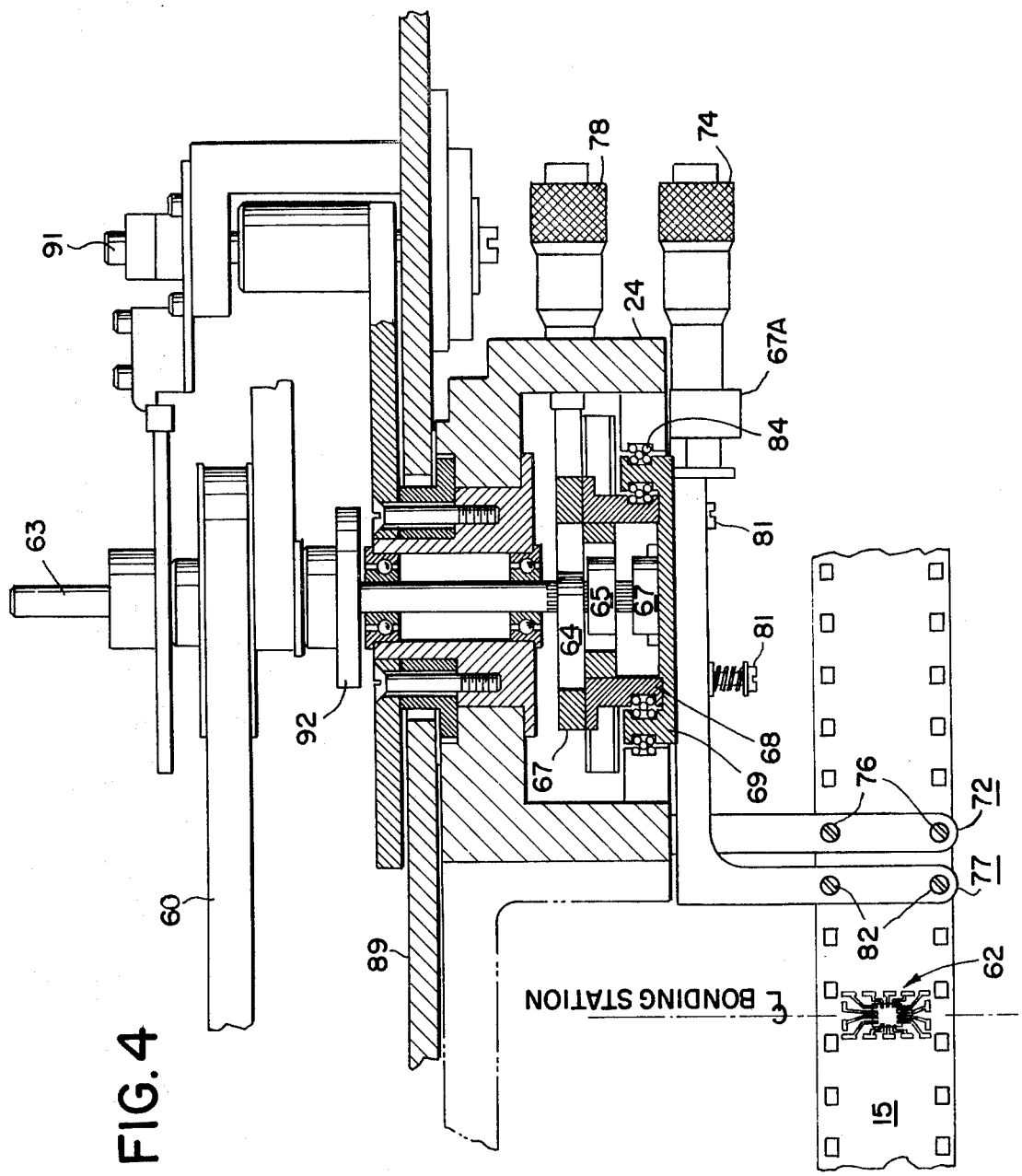
FIG. 4 is an enlarged plan view in partial section showing the drive mechanism for the index station.

Refer now to FIGS. 3, 4 and 1 showing the index station 19. After the aforementioned bonding operation is complete, drive cam 36 is again rotated in the clockwise direction driving tool holder 43 vertically upward. Index station lifting cam 59 then drives follower 61, mounted on index housing 24, upward causing the tape 15 to lift the integrated circuit chip off the vacuum chuck 34. While the tape is in the lifted or up position it may be advanced without disturbing the other adjacent integrated circuit chips. It will be understood that a complete wafer of chips in a precision sawcut and separated matrix may be employed and individual integrated circuit ships may be bonded to a desired pattern on the tape 15 and removed from the matrix without disturbing the adjacent integrated circuit chips.

In a preferred manual mode of operation, the operator observes both the lead pattern and the integrated circuit chip terminals, and has the option to reject either the pattern or the integrated circuit chip. Rejection of a faulty lead frame pattern will advance a new lead frame pattern opposite the bonding station. Rejection of an integrated circuit chip will cause the automatic X-Y table to advance a new integrated circuit chip under the bonding station 33. The integrated circuit chips may be manually advanced, especially when presented in a loose array.

Figure 5:
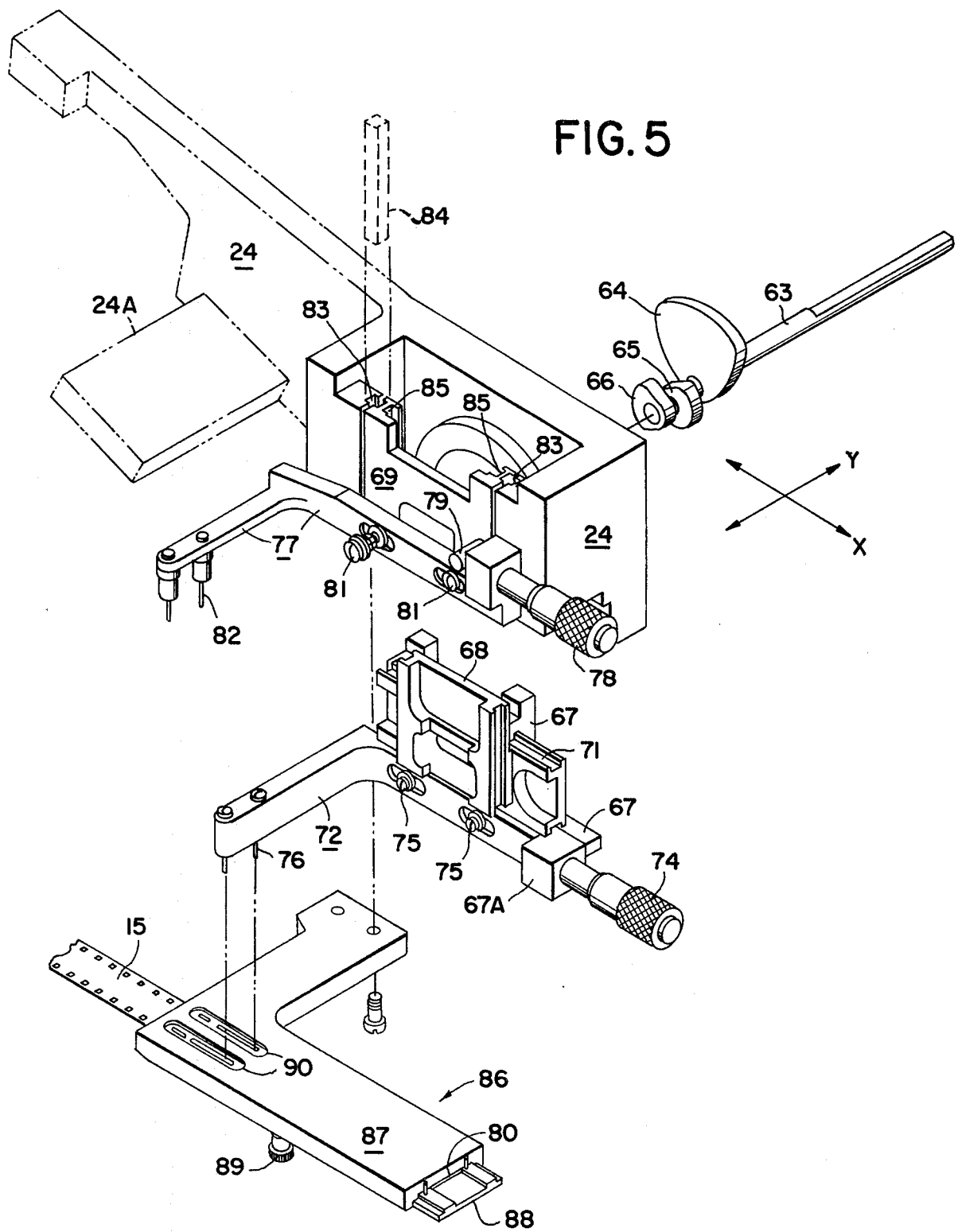
FIG. 5 is an exploded isometric view of the index station showing the feed fingers and the cam followers.

A feature of the present invention concern the repeatitive precision with which a flexible lead frame pattern 62 may be located relative to the bonding station 33. After index station lifting cam 59 raises housing 24 and tape 15 with an integrated circuit chip attached to the lead frame pattern 62, the tape may be advanced. Index drive motor (not shown) will cycle lifting cam 59 and drive shaft 63 via belt 60. Drive shaft 63 drives three push-pull cams 64, 65, and 66 which are captured in two sided followers 67, 68 and 69. Cam 64 drives two-sided cam follower 67 horizontally to and fro. Follower 67 is slidably mounted on horizontal guides 71 on follower 68. Cam 65 drives two sided follower 68 vertically up and down carrying follower 67 and micrometer mount 67A therewith. Advancing claw 72 is adjustably mounted on follower 67. Spring 73 biases advancing claw 72 against advancing claw micrometer 74. Claw 72 is locked by screws 75. It will be understood that the open ended two sided cam followers 67 and 68 permit advancing claw 72 to be driven in a substantially rectangular path. The fingers 76 on claw 72 raise vertically out of sprocket holes in tape 15, move horizontally to the left in FIGS. 3, 4 and 5 the distance of one lead frame pattern and drop vertically into new sprocket holes. The horizontal stroke of cam 65 is machined to provide the exact movement of one lead frame pattern 62. The fingers 76 on claw 72 are preferably positioned by micrometer 74 to advance lead frame patterns 62 short of the alignment with bonding station 33 by a few thousandths of an inch.

After lead frame 62 is advanced by finger 76, cam 66 drives two sided follower 69 vertically downward. Locking claw 77 is adjustably mounted on follower 69. Locking claw micrometer 78 is mounted on claw 77 and engages with a pin 79 on follower 69 to position claw 77 relative to follower 69. A spring (not shown) biases micrometer 78 against pin 79. Claw 77 is locked in its adjusted position by screws 81.

In the preferred embodiment, fingers 82 of claw 77 are provided with a slight cam taper. When the lead frame pattern 62 is advanced rapidly as in the automatic mode of operation, the pattern is aligned short of station 33 and the cam taper on fingers 82 impart the final and exact alignment with station 33.

In a slow mode of operation, fingers 76 are capable of precise alignment of pattern 62 relative to bonding station 33. However, in the preferred mode of operation, final adjustments are made with the fingers 82 of locking claw 77. Fingers 82 are precision machined to fill the sprocket holes in the axial direction, thus, locking the tape 15 against axial movement when the fingers 82 are in the down position.

Follower 69 is guided in grooves 83 by linear bail races 84 which are preloaded to eliminate any play. Follower 68 is guided in grooves 82 on follower 69 by linear ball races (not shown).

Advancing guide plate 86 is mounted on housing 24 and comprises an L-shaped plate with a U-shaped recess 80 in the bottom of the axial arm 87. The recess in axial arm 87 is closed with a cover plate 88 and held in place by a quick release screw 89. Double counter bored slots 90 in plate 86 permit finger 76 to enter the sprocket holes of tape 15.

Support arm 89 is pivoted shaft 91 at the right end of arm 89. The left end of arm 89 is supported by cam 92 via shaft 63. Cam 92 is supported on a stationary bearing (not shown in FIG. 4) below cam 92. Cam 92 and cam 59 impart the same vertical motion to the right and left side of housing 24, thus, providing substantial vertical motion thereto. It will be understood that housing 24 is provided with its own drive to impart vertical motion to the index station 19 and may be mounted for horizontal movement is desirable when it is necessary to adjust the tape relative to the bonding station as may occur when employing highly precision automatic X-Y tables 35.

Refer now to FIGS. 3 and 6 to 8 showing the prefer embodiment tape transverse positioning guide 21. The purpose of this transverse positioning guide 21 is to guide the lead frame tape 15 under the shoe 22 and to accurately position the tape in a transverse direction relative to the bonding station. Guide 21 also imparts a slight tension drag on the tape 15 between the transverse positioning guide 21 and the locking claw finger 82.

Guide plate 93 has a U-shaped recess therein for receiving tape 15 which is wider than tape 15. After tape 15 is aligned in the proper recess 99, cover plate 101 is attached over the recess and held in place by quick release screw 102. Friction clamp springs 103 are mounted on recessed ledges 104 of guide plates 93 by screws 100. Springs 103 clamp the outer edges of tape 15 to cover plate 101 and provide the slight tension drag desired to maintain the tape 15 and the lead frame pattern 62 thereon in a positive position relative to bonding station 33.

When tape 15 was placed in recess 99, lever spring 105 was positioned by cam knob 106 away from the tape 15. Knob 106 is held on guide plate 93 by screw 107. After tape 15 is held in place in recess 99 by cover plate 101, knob 106 is rotated to present the flat 108 on knob 106 to lever spring 105 (as best shown in FIG. 8) permitting lever spring 105 to move and engage tape 15 against two guide pins 109, thus, accurately maintaining the transverse position of the tape established by micrometer 58.

Refer now to FIGS. 3, 9 and 10 showing bonding station 33 slidably mounted on a support arm 111. Arm 111 is connected to support frame 11 through hole 112 in housing 24. Bonding station 33 is vertically guided on bearings 113 which slide on bearing rod 114 extending from arm 111. Bonding tool holder 43 of bonding station 33 comprises two sides 43A and 43B. Side 43B provides a pincer clamp and holer for mounting bonding tip 44. Clamp knob 115 has a screw which extends through side 43B and engages into threads in sides 43A to adjustably clamp bonding tip 44 there between.

FIG. 10 shows thermocouple housing 116 mounted on side 43A. Spring loaded thermocouple probe 117 yieldingly engages the inside of bonding tip 44. Screw 118 extends through clamp piece 119 and is threadably engaged in side 43A. Screw 121 locks the narrow neck of thermocouple housing 116 to clamp piece 119. Hollow sleeve 122 extends from the neck of the housing of 116. Thermocouple probe 117 extends through sleeve 122 and has a flange 123 mounted thereon. Spring 124 is compressed between the housing 116 and the flange 123 and provides pressure engagement of thermocouple 116 against the inside of bonding 44.

As best shown in FIGS. 3 and 9, drive lever 42 has a roller 124 thereon which engages the notch 125 in the side of bonding tool holder 43A. As previously explained, drive cam 36 permits load spring 45 to move drive lever 42 so that bonding tip 44 engages the conductive leads of pattern 62 against the terminals of the integrated circuit chips.

While bonding tip 44 may be operated in a constant temperature mode, the embodiment shown may also be operated in a pulsed power mode. Pulsing the bonding tip 44 via power leads 126 permits the conductive leads of pattern 62 to be solder attached to the terminals of the integrated circuit chip or substrate. When making solder and/or solder eutectic bond, a molten bond at the interface of the connected members must be allowed to cool sufficiently to hold the members in place before removing the bonding tip. Better control is effected when applying pulse power to the bonding tip rather than applying a chilled gas to a constant temperature bonding tip.

Shoe 22 of bonding station 33 is mounted on housing 24. The lower face of the tip of shoe 22 is provided with vacuum manifold means 127. The vacuum manifold means comprise a plurality of vertical holes connected by horizontal cross drilled passages 128 which are connected to a vacuum supply line 129. The tape 15 leads which are opposite the side of shoe 22 are inclined at an angle relative to the horizontal planar face of vacuum manifold 127. The holes in shoe 22 are arranged to contact the tape adjacent to the leads of pattern 62 so as to hold the pattern 62 in a mutual horizontal plane with the conductive leads of pattern 62 extending into the aperture 131.

Figure 11:
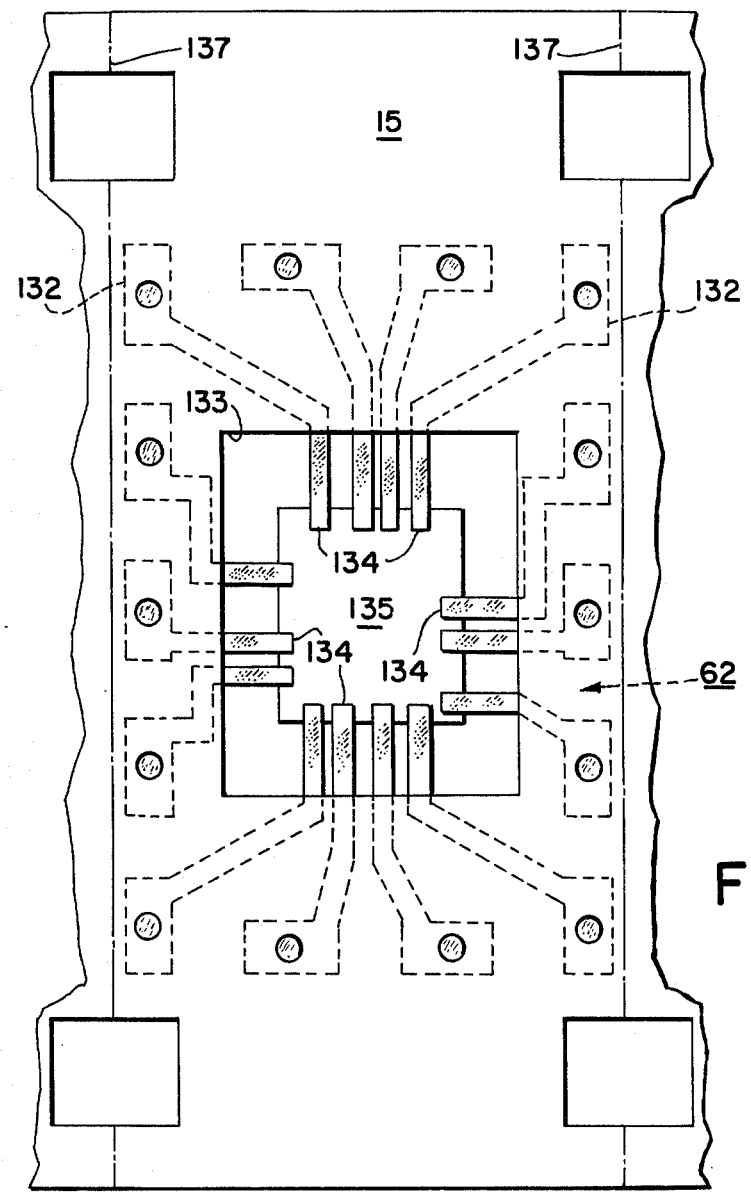
FIG. 11 is a detailed planned view of a section of sprocketed lead frame tape showing the flexible leads superimposed over an integrated circuit device or chip.

Refer now to FIG. 11 showing a piece of sprocketed lead frame tape 15 having a conductive metal lead pattern 62 on the underside of the tape 15. The fourteen conductive leads 134 extend inwardly from outer terminals 132 into aperture 133 in tape 15. The flexible cantilevered leads 134 terminate over conductive terminals (not shown) on integrated circuit chip 135. It will be understood that when the conductive leads 134 are positioned and justaposed the terminals on the integrated circuit chip 135, the bonding operation is initiated. The hot bonding tip simultaneously presses leads 134 downward at a slight angle and bonds them to the terminal on the integrated circuit chip 135 so that the underside of leads 134 clear the active edges of the integrated circuit chip 135.

In the preferred embodiment tape 15 shown in FIG. 11 the flexible conductive leads 134 of pattern 62 extend into an inner aperture 133, thus, defining an inner lead pattern 62. When the pattern of flexible leads extend outward from a lead frame tape into aperture they usually terminate over a substrate or carrier, and the bonding operation is substantially the same.

Flexible lead bonding applies the energy of the bonding tip directly to the conductive flexible leads to be bonded and never through the tape 15 which insulates and isolates the flexible conductive leads from the transfer of energy.

After the inner leads 134 are bonded to an integrated circuit chip 135, the tape 15 is cut away along trim lines 137 to release the pattern 62 and the attached integrated circuit chip 135. The integrated circuit device assembly may then be attached to a substrate or carrier (not shown) by oven soldering, thermo compression bonding, pulse reflow soldering or spot welding. Apertures 136 in tape 15 will permit a bonding tool to directly engage the metal conductor terminals 132 of the pattern 62 for this purpose.

Having explained a preferred embodiment bonding machine with reference to eutectic bonding, a pattern of flexible conducting inner leads and an integrated circuit chip, those skilled in the art will recognize that the bonding tip 44 and shoe 22 may be modified to accept an outer lead pattern to be bonded to a substrate or carrier (not shown).

We claim:

1. Apparatus for simultaneously bonding a plurality of electrical conductive flexible leads on a sprocketed lead frame tape to a rigid device comprising:
   a support frame,
   a tape supply reel rotateably mounted on said frame,
   a sprocketed lead frame tape on said supply reel,
   a first metering sprocket for pulling said lead frame tape from said supply reel,
   a tape take-up reel rotatably mounted on said frame,
   a second metering sprocket for paying out said lead frame tape to said take up reel,
   said metering sprockets eliminating tension in said tape therebetween,
   an index station intermediate said metering sprockets comprising a movable housing, having a tape transverse positioning guide for receiving said tape from said first metering sprocket, means for vertically positioning said lead frame tape, means for guiding said lead frame tape to said second metering sprocket and means for advancing said lead frame tape thereon.
   said means for advancing said lead frame tape comprising an advancing tape means and a locking tape means,
   a bonding station mounted on said support frame for bonding said flexible leads of said lead frame tape to said rigid device after said lead frame tape is advanced and positioned and locked in said indexing station by said advancing tape means and said locking tape means.
   support means for said device, and,
   means for vertically moving said indexing station independently of said tape reels between a position adjacent said support means and a position remote to said support means.

2. Apparatus for simultaneously bonding a plurality of electrical conductive flexible leads on a sprocketed lead frame tape to a rigid device comprising:
   a support frame,
   a tape supply reel mounted on said frame,
   a sprocketed lead frame tape on said supply reel,
   a first metering sprocket for pulling said lead frame tape from said supply reel,
   a tape take-up reel rotatably mounted on said frame,
   a second metering sprocket for paying out said lead frame tape to said take-up reel,
   an index station intermediate said metering sprockets comprising a housing and means for advancing said lead frame tape.
   said means for advancing said lead frame tape comprising an advancing tape means and a locking tape means, and
   a bonding station mounted on said support frame for bonding said flexible leads of said lead frame tape to said rigid device after said lead frame tape is advanced and positioned and locked in said said indexing station by said advancing tape means and said locking tape means,
   said bonding station comprising a guide arm mounted on said support frame, a vertically movable bonding tool holder slidably mounted on said guide arm, lever actuating means pivotably mounted on said support frame, said lever actuating means comprising a cam follower engaging a drive cam and spring means for urging said cam follower into engagement with said drive cam, and a load cell connected to said spring means for indicating the spring force being applied to said vertically movable bonding tool holder during a bonding operation of said flexible leads to said rigid device.

3. Apparatus for simultaneously bonding a plurality of electrical conductive flexible leads on a sprocketed lead frame tape to a rigid device comprising:
   a support frame,
   a tape supply reel mounted on said frame,
   a sprocketed lead frame tape on said supply reel, a first metering sprocket for pulling said lead frame tape from said supply reel, a tape take-up reel rotatably mounted on said frame, a second metering sprocket for paying out said lead frame tape to said take-up reel, an index station intermediate said metering sprockets comprising a housing and means for advancing said lead frame tape, said means for advancing said lead frame tape comprising an advancing tape means and a locking tape means, and a bonding station mounted on said support frame for bonding said flexible leads of said lead frame tape to said rigid device after said lead frame tape is advanced and positioned and locked in said indexing station by said advancing tape means and said locking tape means, said index station further includes a tape guide shoe supported by said housing and having a contact surface thereon for engaging said lead frame tape at said flexible leads, and vacuum manifold means in said tape guide shoe for urging said flexible leads into a common horizontal plane parallel to the surface of said rigid device.

4. Apparatus as set forth in claim 1 wherein said means for advancing said lead frame tape further includes three push-pull cams each cooperating with a two sided follower for moving said tape means normal and parallel to said lead frame tape.

5. Apparatus as set forth in claim 4 wherein two of said push pull cams impart motion to said advancing tape means and one of said push-pull cams impart substantially vertical motion to said locking tape means independent of the motion of said advancing tape means.

6. Apparatus as set forth in claim 1 wherein said advancing tape means and said locking tape means are slidably mounted for adjustable movement on said index station housing in a direction which is parallel to the movement of said lead frame tape.

7. Apparatus as set forth in claim 6 where in said advancing tape means and said locking tape means are independently adjustable of each other in a direction parallel to the movement of said lead frame tape.

8. Apparatus as set forth in claim 1 wherein said tape transverse positioning guide is mounted for adjustable transverse movement on said index station housing.

9. Apparatus as set forth in claim 1 wherein said tape transverse positioning guide further comprises a recess track which is wider than said lead frame tape and further comprises means for urging said lead frame tape against a guide edge of said recess track.

10. Apparatus as set forth in claim 9 wherein said means for vertically positioning said lead frame tape comprises said recess track of said transverse positioning guide and further includes a recess in an advancing guide plate of said means for advancing said lead frame tape.

11. Apparatus as set forth in claim 10 which further include a pair of removable bottom cover plates cooperable with said recess track of said transverse positioning guide and said recess of said advancing guide plte to form closed guides for said lead frame tape.

12. Apparatus as set forth in claim 1 wherein said tape transverse positioning guide further comprises a recess track for receiving said lead frame tape and a friction clamp mounted in said recess track adjacent said bonding station.

13. Apparatus as set forth in claim 1 wherein said tape supply reel and said take-up reel are each driven by adjustable constant torque motors for maintaning constant tension between said reels and said metering sprockets.

14. Apparatus as set forth in claim 1 wherein said bonding station comprises a supporting guide arm mounted on said support frame, a vertically movable bonding tool holder mounted on said guide arm, said bonding tool holder to receive a removable bonding tip therein, and a thermocouple means mounted on said bonding tool holder for engagement with said removable bonding tip, and a spring mounted between said bonded tool holder and said thermocouple for urging said thermocouple into engagement with said bonding tip.

15. Apparatus as set forth in claim 1 wherein said index station is supported by said housing and said housing is mounted for movement in a horizontal plane relative to said support frame.

16. Apparatus as set forth in claim 15 wherein said bonding station further comprises bonding anvil means for supporting said rigid device in a horizontal plane parallel to said lead frame tape, said bonding anvil means having means for vertically raising and lowering said device.

17. Apparatus as set forth in claim 2 wherein said load cell further includes digital read out means for indicating the spring force being applied to said bonding tool, and screw means for adjusting the force being applied on said load cell and said spring means.

18. Apparatus as set forth in claim 3 wherein said contact surface comprises a plurality of vacuum holds juxtaposed the area of said lead frame tape adjacent said flexible leads.

* * * * *